United States Patent [19]

Signorelli

[11] Patent Number: 4,823,572

[45] Date of Patent: Apr. 25, 1989

[54] LOCKABLE TERMINAL COVER FOR BOTTOM CONNECTED METERING DEVICES

[76] Inventor: John A. Signorelli, 2150 East 29th St., Brooklyn, N.Y. 11229

[21] Appl. No.: 902,872

[22] Filed: Sep. 2, 1986

[51] Int. Cl.[4] ............................................. B65D 55/14
[52] U.S. Cl. ....................................... 70/163; 70/416; 70/166; 70/34
[58] Field of Search ................. 70/163, 164, 166, 167, 70/168, 229, 230, 232, 416, 417, 34; 339/133, 134; 324/110

[56] References Cited

U.S. PATENT DOCUMENTS

| | | | |
|---|---|---|---|
| 1,603,580 | 10/1926 | Cahill, Jr. | 324/110 |
| 1,647,566 | 11/1927 | Gillen | 324/110 |
| 1,681,766 | 8/1928 | Gillen | 324/110 X |
| 2,118,638 | 5/1938 | Bakke | 324/110 |
| 2,162,548 | 6/1939 | Campbell | 324/110 |
| 2,359,628 | 10/1944 | Daly | 324/110 |
| 2,987,909 | 6/1961 | Shlank | 439/133 X |
| 2,991,398 | 7/1961 | Strong | 439/133 X |
| 3,157,040 | 11/1964 | Raye | 70/232 X |
| 3,861,180 | 1/1975 | Heckrotte et al. | 70/164 |
| 3,867,822 | 2/1975 | Morse et al. | 70/164 |
| 3,996,501 | 12/1976 | Tracey | 439/133 X |
| 4,008,585 | 2/1977 | Lundberg | 70/164 |
| 4,107,959 | 8/1978 | Skarzynski et al. | 70/164 X |
| 4,144,729 | 3/1979 | Nielsen, Jr. | 70/232 X |
| 4,162,516 | 7/1979 | Becker | 439/133 X |
| 4,300,373 | 11/1981 | Camos et al. | 70/164 X |
| 4,313,319 | 2/1982 | Haus, Jr. et al. | 70/34 |
| 4,329,860 | 5/1982 | Moberg | 70/232 X |
| 4,331,012 | 5/1982 | Swisher | 70/164 |
| 4,345,448 | 8/1982 | Solomon | 70/416 X |
| 4,406,358 | 9/1983 | Zahradnik | 70/164 X |
| 4,407,146 | 10/1983 | Nielsen, Jr. | 70/232 |
| 4,413,490 | 11/1983 | Nielsen, Jr. | 70/164 |
| 4,674,304 | 6/1987 | Guiler | 70/232 X |
| 4,704,881 | 11/1987 | Sloop, Sr. | 70/158 |

Primary Examiner—Robert L. Wolfe
Assistant Examiner—Suzanne L. Dino
Attorney, Agent, or Firm—Brooks Haidt Haffner & Delahunty

[57] ABSTRACT

Locking apparatus for bottom connected electrical meters which, in one embodiment, includes a secondary cover over the meter terminal block and intermediate the primary cover and the meter base, the secondary cover being secured to the base by screws which are covered by the primary cover. The secondary cover has an apertured stud thereon which extends through the primary cover and receives a lock to prevent removal of the primary cover. The protruding end of the stud may be covered by an apertured block secured to the primary cover. In a second embodiment, the stud is omitted, and the lock extends through the primary cover and into an opening in the meter base, the lock having a portion which engages the primary cover and prevents removal thereof. In the second embodiment, a detector, such as a switch, within the base and operable by the lock indicates the presence or absence of the lock.

17 Claims, 5 Drawing Sheets

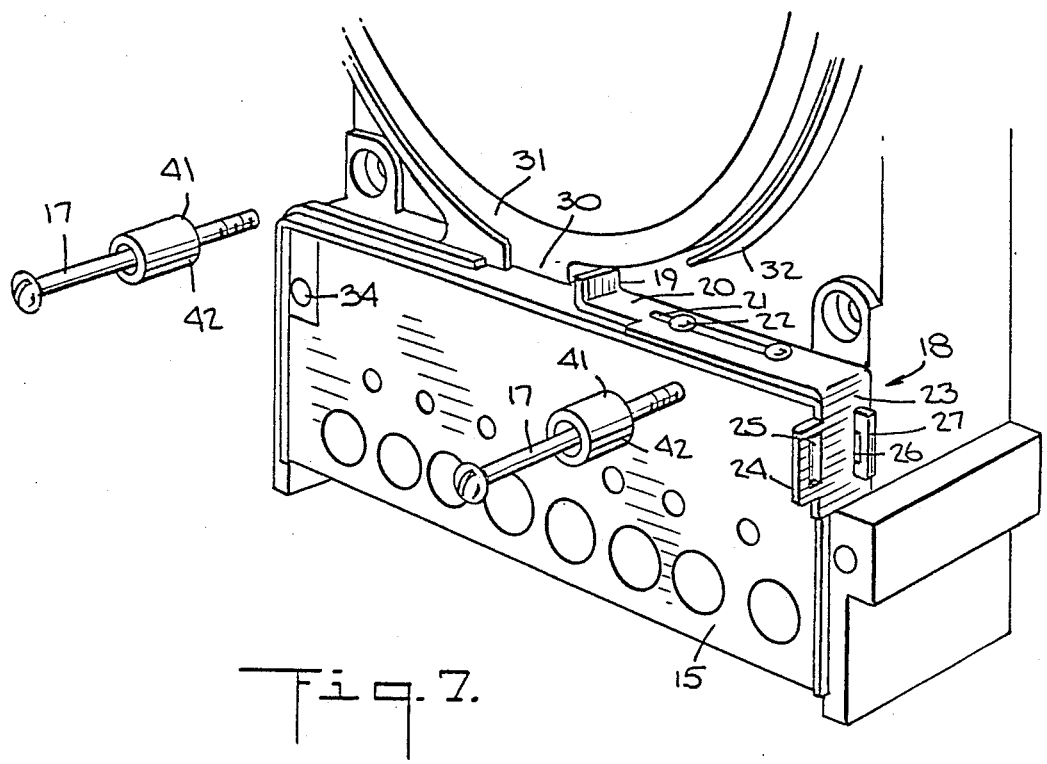
Fig. 7.
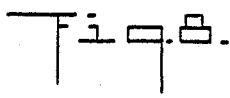
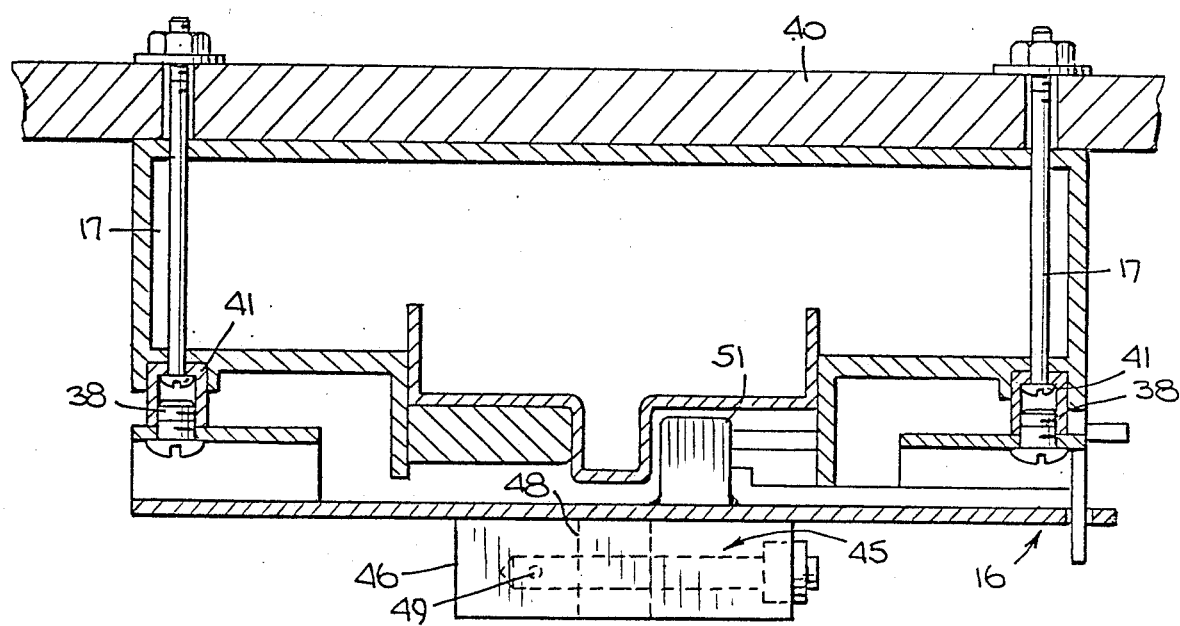

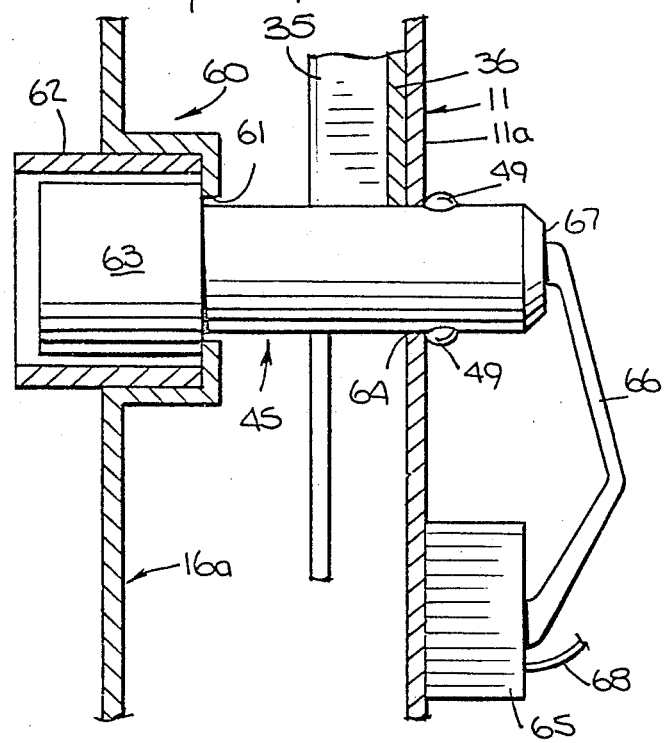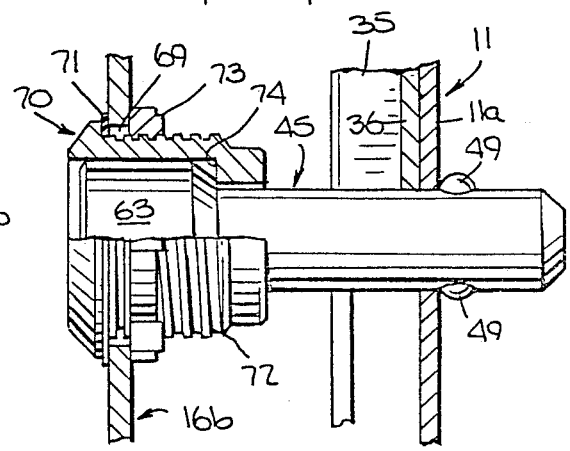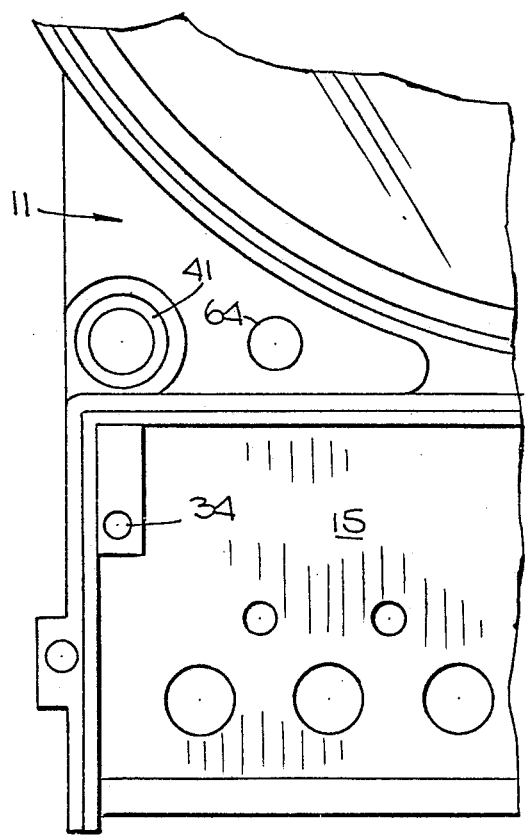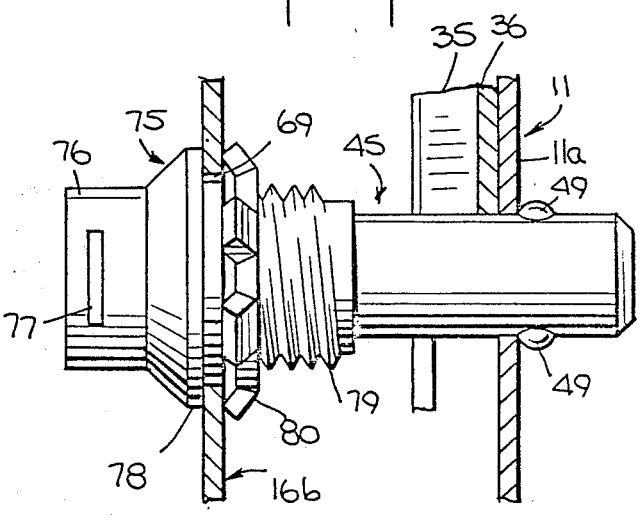

LOCKABLE TERMINAL COVER FOR BOTTOM CONNECTED METERING DEVICES

BACKGROUND OF THE INVENTION

1. Field of the Invention

The invention relates to improving the security of metering devices against tampering and theft of services, and more particularly to means for locking in place the terminal chamber covers of bottom connected electrical meters.

2. Description of the Prior Art

Electric metering devices are available and in general use for measuring the quantity of energy and power of residential and commercial users of electricity. One common meter configuration, called a bottom connected or "A" base meter permits connection of electrical service wires or current transformer secondary leads to the meter's base or terminal block. "A" base meters are most widely used for metering electrical services of commercial and industrial customers of electric power utility companies.

Meter manufacturers have standardized the dimensions and wiring details of "A" base meters, so that a general description of those meters to which the present invention is applicable can be given.

The typical bottom connected meter is mounted on a wall of a building and held securely in place by two or more mounting screws which pass through the body of the meter from front to back. Means for displaying the measured quantity, such as kilowatt hours of energy consumed, are disposed within a transparent dome-like cover of the meter. This cover, usually of glass with a metal rim for securing it to the body of the meter, encloses not only the dials or register showing energy and/or power consumed, but also the meter's electricity measuring circuitry, all of which becomes accessible if the transparent cover is removed. The cover is screwed into position by rotation so that means on the cover's rim engage mating means on a projecting flange on the front face of the meter's body. The mounting flange is in the form of an incomplete ring with a break at its lower portion.

A terminal block to which wiring entering and leaving the meter connects is disposed below the portion of the meter covered by the transparent dome. The electrical wires are secured to the terminal block by screws located at the front of the block. The heads of these wire-securing screws are normally concealed by a terminal block cover which extends across the lower front portion of the meter, beneath the glass cover.

The terminal block cover protects the terminal block and receives a sealing bar which passes horizontally through part of the block cover from one side. The terminal block cover sealing bar has slots and/or holes to permit seals, for example, a power company's unique plastic, lead wire or padlock sealing means to be installed, so that an attempt to tamper with the meter can be detected by inspecting the integrity of the seal.

An upwardly projecting lip on the inner end of the sealing bar is positioned to interfere with rotation of the glass cover when the meter is sealed. This prevents removal of the transparent cover by unauthorized persons who might attempt to set back the meter's register or otherwise tamper with the meter in order to steal electrical service.

Although seals made of aluminum, thin wire or plastic are in common use, such seals are easily cut off, and the tamperer may attempt to replace the seal, duplicate the seal, or may simply deny having interfered with the seal.

A second very serious weakness in the security of "A" base meters is the sealing bar lip, which has as its sole purpose interference with a protrusion on the rim of the meter's transparent cover to prevent the cover's removal. The lip is made of aluminum or other soft material and is exposed to tampering because it is not concealed by the terminal block cover, so the lip can be filed, cut, ground off, etc., by a tamperer so that it no longer prevents removal of the glass cover. By damaging the sealing bar lip, an unauthorized person can gain entry to the meter's internal components without having to break the seal or remove the terminal block cover. Such tampering can be less noticeable than violation of the meter seal, and may go undetected by service personnel, such as meter readers.

It is highly desirable to prevent tampering and damage to meters and other utility equipment, so various kinds of locks have been developed for securing doors, covers, etc. One such type of lock is the barrel lock, exemplified by the lock of U.S. Pat. No. 4,040,279. Barrel locks have an overall cylindrical shape to fit within a cylindrical receptacle which has an internal recess or recesses to receive locking balls which project radially outward when the lock is in locked or engaged condition, and which are retractable when a proper key is used to "open" the lock.

The present invention relates generally to ways in which locks such as barrel-type locks can be used to secure the terminal block covers of electric meters of the type described against tampering.

SUMMARY OF THE INVENTION

A barrel-type lock, such as the lock described in U.S. Pat. No. 4,040,279 can be used to lock in place the terminal block cover of a bottom connected electrical meter.

d locking arrangement for use on existing manufactured and installed meters according to the invention employs an internal, secondary cover mounted within the chamber which houses the meter's terminal block. This secondary cover is secured in place in front of the terminal block and has a projecting stud with a diametrical hole through the stud for receiving the barrel of a barrel-type lock. The secondary cover's stud passes through a mating hole in the meter's primary cover with its diametral hole in front of the primary terminal block cover so that the barrel-type lock can be inserted therethrough when the primary cover is in place. The primary cover can have means, such as a bar affixed to the front of the cover for reception of the projecting end of the stud and insertion of the lock's barrel to fit through the hole in the stud. The locking balls of the barrel-type lock are received within a mating groove or grooves when the lock is engaged so that the terminal block cover cannot be removed.

In an alternative embodiment, that is preferred for use in newly manufactured meters, the projecting stud on the secondary cover is omitted, and the barrel lock is inserted through an opening in the primary cover and through an opening in the wall of the meter base, the locking balls of the lock engaging the interior surface of the wall of the meter base and the head of the lock engaging the primary cover to prevent unauthorized removal of the primary cover. The alternative embodiment allows a barrel lock to enter the meter's internal area and activate a remote sensor such as a microswitch for remote monitoring and detection of the meter's security status.

The primary cover can also advantageously be provided with means for protecting the lip of the meter's sealing bar and the glass cover's rim protrusion with which the lip interferes to prevent removal of the dome-like glass cover.

Mounting holes through which the mounting screws pass to attach the meter to a wall or other surface can be used for securing the secondary cover in place in the terminal block chamber by use of inserts which are adapted to receive screws for holding the secondary cover in place.

These and other useful and advantageous features of the lockable terminal cover of the invention will be more fully understood when the following detailed description of the invention is read with reference to the accompanying figures throughout which like reference characters indicate like parts.

BRIEF DESCRIPTION OF THE DRAWINGS

FIG. 7 shows the manner of providing inserts for adapting the meter's mounting screws to secure a secondary terminal block cover.

FIG. 8 is a view in section taken along line 8—8 of FIG. 2 and looking in the direction of the arrows with some hidden parts shown by dashed lines.

FIG. 9 is a fragmentary cross-section of the alternative embodiment of the invention, with parts omitted for ease in illustration, in which the primary cover is secured to a wall of the meter base by a lock engaging the primary cover and extending through an opening in the wall of the meter base to engage a detecting means operable by the lock.

FIG. 10 is a fragmentary view of the meter shown in FIG. 6 modified to provide an opening in the wall of the meter base to receive the lock shown in FIG. 9.

FIGS. 11 and 12 are similar to FIG. 9 and illustrates alternative ways of connecting the lock to the primary cover.

DETAILED DESCRIPTION OF A PREFERRED EMBODIMENT

Figure 1:
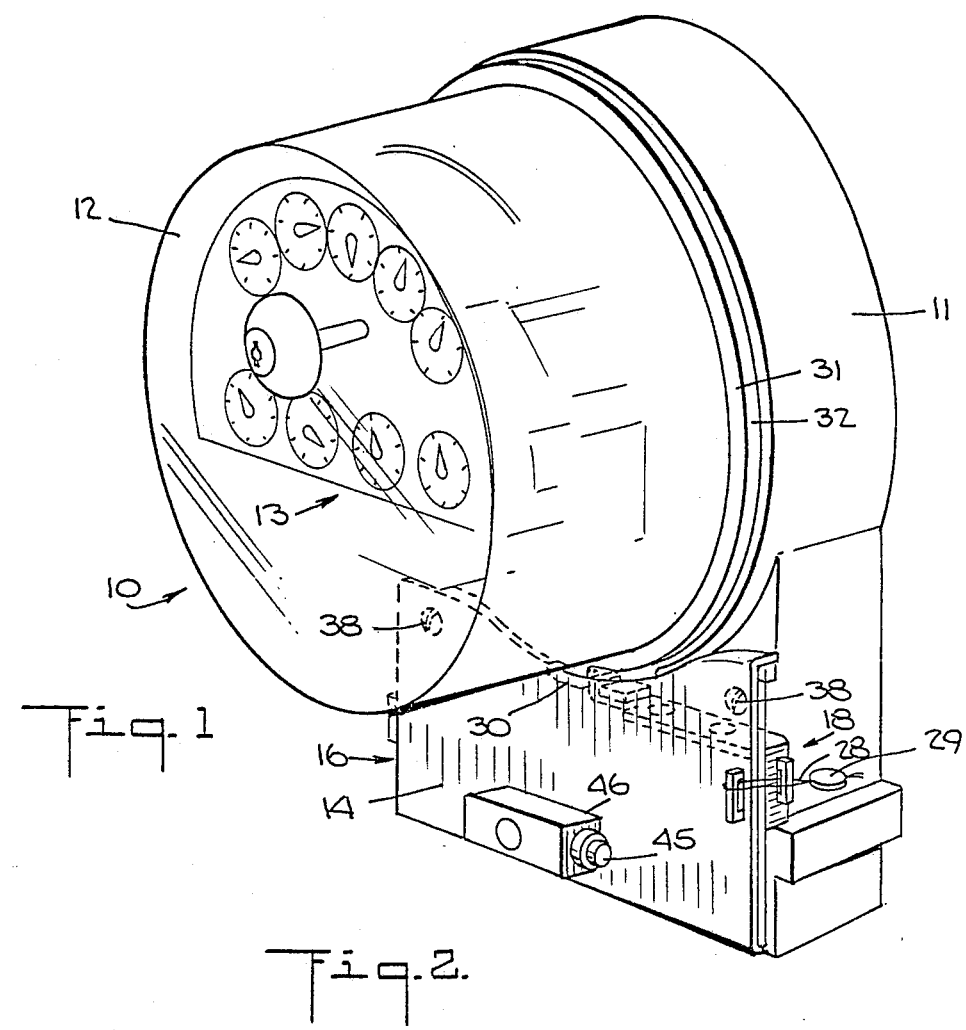
FIG 1 is a view in perspective of a typical bottom connected, or "A" base electrical meter equipped with a lockable terminal block cover in accordance with the invention.

A typical bottom connected or "A" base meter of the kind widely used by electrical utilities for measuring the quantity of electrical service used by commercial and industrial customers is shown in FIG. 1. The meter generally designated by reference numeral 10, has a base 11 which can be secured at a convenient height to a wall or other surface. The meter 10 has a dome-like transparent cover 12, usually of glass, which encloses the electricity-metering components as well as a register 13 which shows the measured quantity, such as kilowatthours. The electrical circuitry and moving parts of the meter need no description, since the present invention is applicable to all meters of the bottom connected type regardless of the details of the internal meter components.

Figure 5:
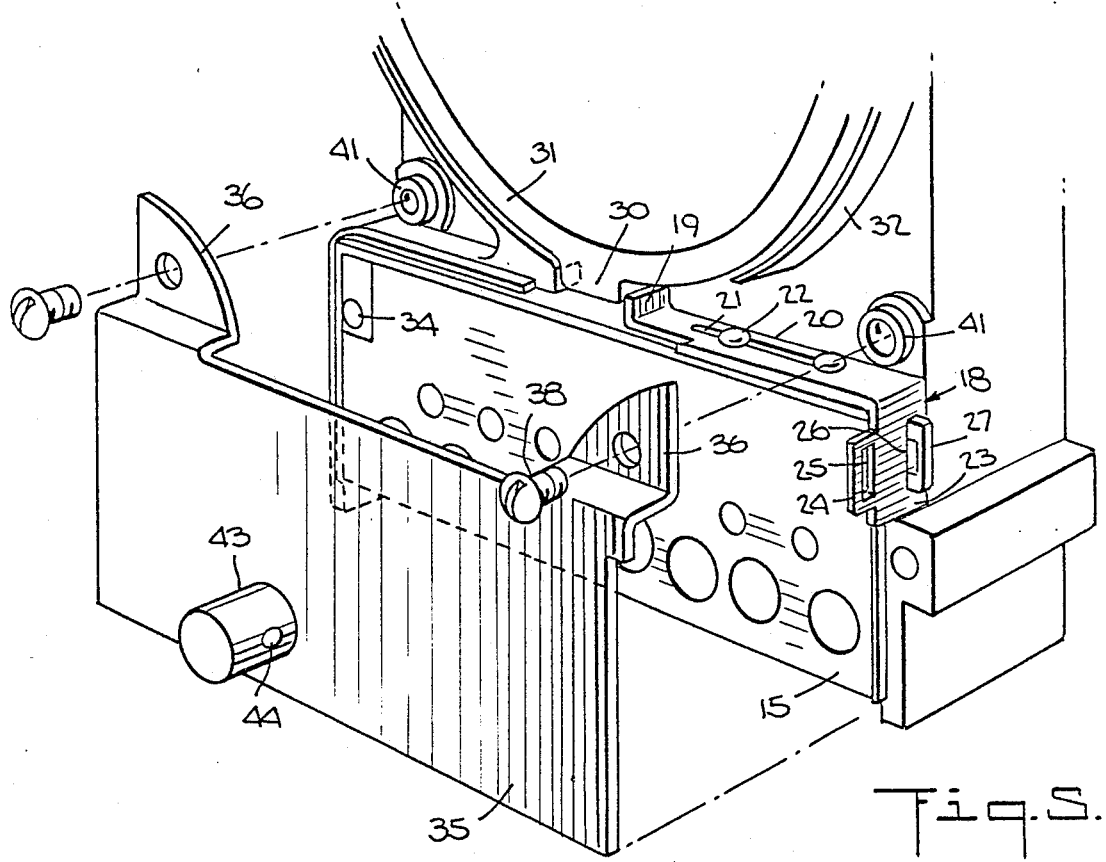
FIG. 5 is an exploded view showing the arrangement for securing the secondary cover of FIG. 4.
Figure 6:
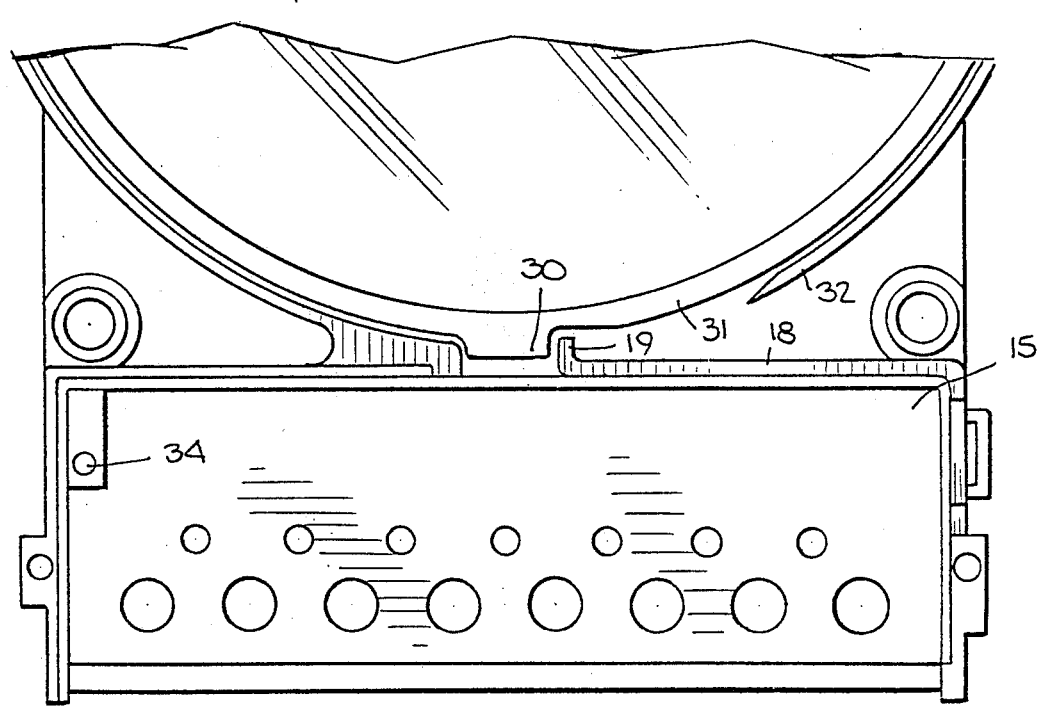
FIG. 6 is a front view of the lower part of the meter of FIG. 1 with the terminal block covers removed.

Meter manufacturers have standardized the dimensions and external wiring connections of bottom connected meters. These meters have a terminal chamber 14 located below the glass cover 12, which chamber houses a terminal block 15 (see FIGS. 5, 6 and 7) to which electrical wires (not shown) entering the meter from below are connected and secured by screws mounted in holes located at the front side of the terminal block 15. Such holes are best seen in FIGS. 5, 6 and 7. A terminal chamber cover 16 protects the terminal block 15 and screws 17 by which the meter 10 is mounted on its supporting surface.

A sealing bar 18 is slidably mounted above the terminal chamber cover 16 as best shown in FIGS. 5 and 7.

Figure 3:
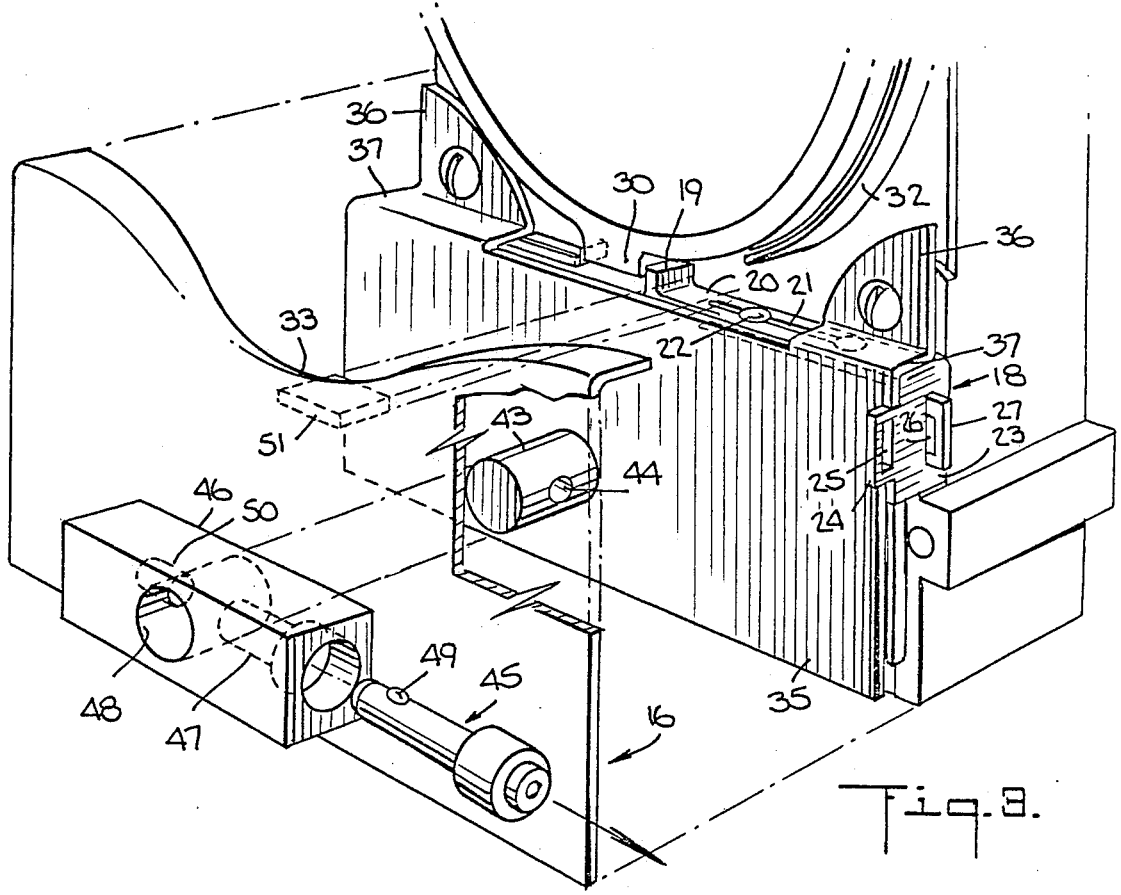
FIG. 3 is an exploded view in detail of the terminal block cover locking arrangement of the invention.
Figure 4:
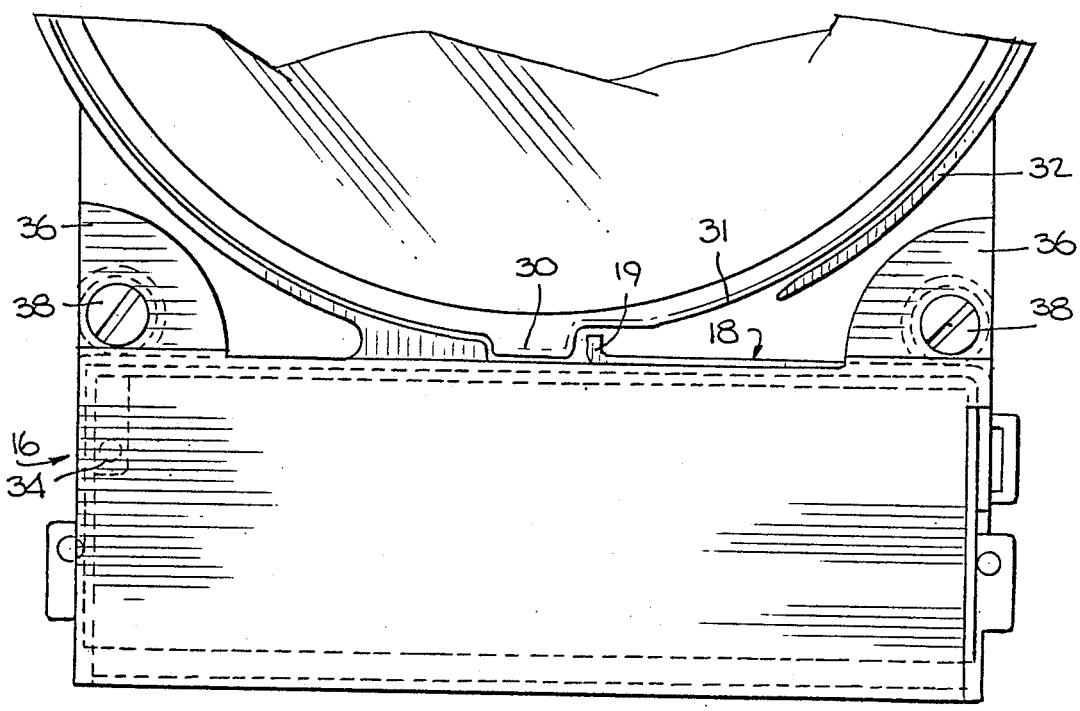
FIG. 4 is a front view showing a secondary cover for the terminal block of a bottom connected meter.

The sealing bar 18 has, as shown in FIGS. 3, 5 and 7, an upturned lip 19 at its inner end, an elongated body 20 which has a longitudinal slot 21 fitting over pin means 22 for allowing the bar 18 to slide horizontally. The outer end of the sealing bar has a downturned portion 23 which has a forward facing ear 24 with a slot 25 therein and a slot 26 located to the rear of the slot 25 for receiving a slotted hasp 27 which projects laterally from the area of the terminal block 15.

Figure 2:
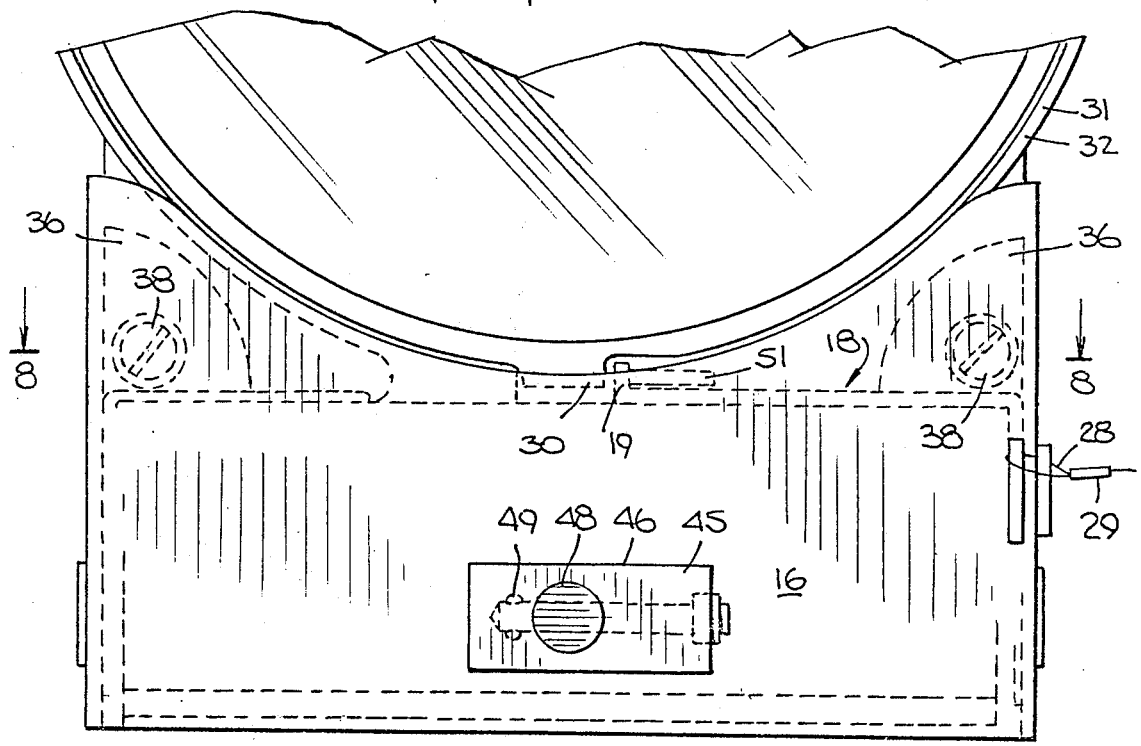
FIG. 2 is a front view in detail of the lower part of the meter of FIG. 1 with dashed lines showing concealed parts.

A conventional seal 28 is shown as a wire passing through the slot 25 of the sealing bar 18 and the slot of the hasp 27 in FIGS. 1 and 2 with means 29 which can be of lead or plastic joining the outer ends of the wire to prevent motion of the sealing bar unless the seal 28 is tampered with. Unauthorized persons can snip the seal 28 to move the sealing bar 18; and then attempt to replace or repair the seal 28 to avoid detection. Seals of types other than the illustrated seal 28 are also known and used.

The inner lip 19 of the sealing bar 18 interferes with the counterclockwise movement of a protrusion 30 of the rim 31 of the meter's glass cover 12. The rim 31 is usually a metal band fitted around the edge of the cover 12 which has internal means, not shown, which interfit with means provided on a flange 32 that projects forward from the meter's base 11. This interfitting arrangement allows the glass cover 12 to be screwed into place and unscrewed for removal by counterclockwise rotation. The presence of the lip 19 prevents. the unscrewing of the glass cover and thus prevents its removal.

The sealing bar 18 and its lip 19 are usually made of soft metal such as aluminum, and those seeking to tamper with a meter can saw or file away the lip 19 in order to remove the glass cover 12 and thus gain access to the working parts of the meter to set back the recording of the register 13 or otherwise interfere with the operation of the meter. This sort of tampering can be accomplished without removal of the terminal block cover 16 or breaking the seal 28. To prevent such attacks on the sealing bar lip 19, the upper edge of the terminal chamber cover at 33 can be formed to cover the lip 19 of the sealing bar as shown in FIG. 3. If it is necessary to see the sealing bar's lip 19, this portion 33 of the terminal chamber cover can be formed of hard transparent material such as Lexan plastic.

Another serious form of tampering involves removal of the terminal chamber cover 16, which is conventionally secured only by the sealing bar 18 and means such as a pin at the area 34 shown at the left of the drawing in FIGS. 4–7. Once the seal 28 has been broken the terminal chamber cover 16 can thus be readily removed. To prevent this, the present invention provides for positive locking in place of the terminal chamber cover 16.

As shown in the drawings, particularly in FIGS. 3 and 5, an internal, secondary terminal chamber cover 35 is fitted over the terminal block 15. The internal cover is generally rectangular and has two ears 36 which extend upward from steps 37 which are bent backward from the main body of the cover to lie over the upper face of the terminal block 15 and the sealing bar 18. Each ear 36 has a hole for receiving a screw 38 to mount the cover 35 firmly on the meter's base 11. A preferred mounting arrangement is shown in FIGS. 7 and 8. Each of the main mounting screws 17 of the meter extends through a bore 39 in the meter base 11 to fasten the meter to a wall or the like, shown as 40 in FIG. 8. A cup-shaped insert 41 having a cylindrical wall 42 and internal threads (not shown) is secured by each mounting screw 17, which passes through a hole in the base of the insert 41. The screws 38 are received by these inserts 41 to secure the secondary cover 35 in place.

A stud 43 projects from the secondary cover 35, preferably at the central part of the secondary cover. The stud 43 has a diametral passage 44 to receive a lock, shown as a barrel-type lock 45, which is fitted outside the primary terminal chamber cover 16, which has a hole for passage of the stud 43. Preferably the cover 16 has means such as the bar 46 welded or otherwise secured to the cover's front face for receiving and protecting the lock 45. The bar 46 has a longitudinal passage 47 and a transverse bore 48 which intersects the passage 47. The stud 43 passes through the cover 16 and into the transverse bore 48 so that the body of the barrel-type lock can pass through the passage 47 and the passage 44 of the stud. When secured in place the locking balls 49 of the lock 45 engage a groove or other recess in the passage 47 at the area 50 to prevent removal of the lock 45 and thus prevent tampering with the meter.

Additional security may be afforded by affixing an L-shaped bar 51 to the inside of the terminal chamber cover 16 as shown in FIGS. 2, 3 and 8 to protect the lip 19 of the sealing bar 18.

In the alternative embodiments illustrated in FIGS. 9–12, the primary cover 16 is modified and the stud 44 and the bar 46 are omitted, but otherwise, the protecting structure is as described hereinbefore and illustrated in FIGS. 1–8.

As illustrated in FIG. 9, the primary cover 16a has a depressed portion 60 thereon which has an opening 61 for the passage of the barrel of the lock 45. The portion 60 may have a tube 62 therein for reinforcing the portion 60 and protecting the head 63 of the lock 45. The tube 62 may have a press fit with the interior of the portion 60 or be otherwise secured to the cover 16a or the portion 60 thereof.

As illustrated in FIGS. 9 and 10, the front wall of the meter base 11, has an opening 64 for the passage of the ball containing end of the lock 45 so that when the lock 45 is inserted as shown in FIG. 9, the head 63 thereof engages a lip on the portion 60 and the ball 49 thereof engages the inner surface 11a of the wall of the meter base thereby preventing removal of the cover 16a without removal of the lock 45.

If necessary, to prevent obstruction of the opening 64, the ear 36 (see FIG. 3), which is adjacent to the opening 64 when the secondary cover 35 is in place, may be shaped differently from the shape shown in FIG. 3 or may have an opening therethrough aligned with the opening 64.

If desired, detecting means for detecting the presence or absence of the lock 45, such as an electrical switch 65, may be secured to the inner surface 11a of the wall of the meter base in any conventional manner, in the embodiment shown in FIG. 9 and in the embodiments shown in FIGS. 11 and 12, with its actuating member 66 operable by the end face 67 of the lock 45. Thus, if the lock 45 is removed, the state of the switch 65 will be changed, and the state of the switch may be indicated electrically and either locally or remotely, such as by telemetering circuits, by connecting the electrical leads 68 to appropriate devices or circuits. It will be observed that the switch 65 is within the meter base 11 and is inaccessible without the removal of the cover 16a and/or the terminal block 15 (see FIG. 10.

Instead of forming the primary cover with a depressed portion 60, the primary cover may merely have a hole therethrough for mounting a tubular member thereon for receiving the head 63 of the lock 45.

As illustrated in FIG. 11, the primary cover 16b has a hole 9 therethrough which receives a tubular member 70 engaging a gasket 71 which bears against the outer surface of the cover 16b. The member 70 has external threads 72 which engage a nut 73 for securing the member 70 to the cover 16b.

The head 63 of the lock 45 engages a lip 74 on the member 70, and the balls 49 engage the inner surface 11a of the wall of the base 11. Therefore, the primary cover 16b cannot be removed until the lock 45 is released.

FIG. 12 is similar to FIG. 11, but illustrates a modified form of the tubular member 70. In FIG. 12, the tubular member 75, which has an inner lip like the lip 74 of the member 70 for engaging the head 63 of the lock 45, has an outer tubular portion 76 for protecting the head 63 of the lock 45 and may also have a pair of diametrically opposed slots, the slot 77 being one such slot, for receiving a wire seal like the wire seal 28,29 shown in FIG. 1.

The portion 78 of the member 75 is larger than the hole 69 and bears against the outer surface of the cover 16b. The member 75 has a threaded portion 79 which receives a nut 80 for securing the member 75 to the cover 16b. Like the embodiment shown in FIG. 11, the cover 16b cannot be removed until the lock 45 is released.

In the alternative embodiments illustrated in FIGS. 9–12, a secondary terminal block cover 35 has been included, but if desired, such cover 35 may be omitted in the alternative embodiments since the terminal block will be protected by the primary cover 16a or 16b which is secured to the meter base by the lock 63.

Preferred embodiments of the security arrangement of the invention have been shown and described. It will be understood by those acquainted with the art that various modifications, substitutions of materials, and the like, may be made while still incorporating the spirit of the invention. For example, the location or orientation of the barrel-type lock could be changed for particular applications. What is described is a lockable terminal cover for bottom connected meters.

I claim:

1. In an electrical meter with electrical consumption measuring means having a base, an enclosure for said electrical consumption measuring means and a sealing bar with a lip for preventing removal of said enclosure, electrical connecting terminals on said base with lock receiving means in fixed relation to said base, and a protective cover for said terminals for preventing access to the latter, the improvement comprising securing means for said cover comprising a key releasable and reusable lock engaging said lock receiving means and having a portion extending in the path of movement of said cover away from said base, said protective cover having a bar secured thereto and extending to adjacent said lip for protecting said lip.

2. In electrical metering apparatus comprising electrical consumption measuring means mounted on a base at one side thereof and walls extending from said base defining an electrical connecting terminal cavity having terminals therein for connecting said measuring means to an electrical power source, said cavity and said terminals being disposed at said side of said base in laterally offset relation to said measuring means and said cavity opening outwardly in the direction away from said base, the improvement comprising a protective cover covering the opening of said cavity without surrounding said measuring means to prevent access to said terminals, said cover having a face facing toward said cavity and extending traversely to said direction and lock receiving means in fixed relation to said base and disposed outside and spaced from said cavity, but disposed on a line intersecting and extending perpendicularly to said face of said cover and spaced from said walls defining said cavity, said lock receiving means having an opening therein receiving a key releasable and reusable lock having a portion which extends into the path of movement of said cover away from said terminals in said direction and said cover having means which prevents unauthorized access to said opening.

3. Electrical metering apparatus as set forth in claim 2 wherein said lock receiving means is an opening in said base and said lock extends through said protective cover to and through said lock receiving means, said portion of said lock being farther from said base than said cover.

4. Electrical metering apparatus as set forth in claim 3 further comprising a secondary cover covering said cavity and intermediate said protective cover and said terminals and secured to said base.

5. Electrical metering apparatus as set forth in claim 3 wherein said protective cover has a portion receiving and engaging said portion of said lock.

6. Electrical metering apparatus as set forth in claim 3 wherein said protective cover has a tubular member secured thereto and receiving and engaging said portion of said lock.

7. Electrical metering apparatus as set forth in claim 3 further comprising detecting means for detecting the position of said lock and operable by said lock mounted in said base.

8. Electrical metering apparatus as set forth in claim 7 wherein said detecting means comprises electrical switch means having an actuating member engaged with said lock, the electrical state of said switch being changeable by movement of said lock.

9. Electrical metering apparatus 3 as set forth in claim wherein said lock is a barrel lock having releasable means engaging the portion of said base around said opening.

10. Electrical metering apparatus as set forth in claim 2, wherein said lock has a locking element, wherein said lock receiving means comprises locking element engaging means secured to said base by securing means and extending through said cover, said cover covering said securing means, and wherein said locking element engages said locking element engaging means.

11. Electrical metering apparatus as set forth in claim 10 wherein said lock engaging means is a stud.

12. Electrical metering apparatus as set forth in claim 10 wherein said lock engaging means comprises a secondary cover covering said cavity and intermediate said cavity and said protective cover and secured to said base by said securing means and a stud secured to said secondary cover and extending through said protective cover.

13. Electrical metering apparatus as set forth in claim 12 wherein said stud has a diametral passage therethrough spaced from said base further than the face of said protection cover facing oppositely to said face of said protective cover for receiving said lock.

14. Electrical metering apparatus as set forth in claim 13 further comprising a bar secured to said oppositely facing face, said bar having a first opening into which said stud extends and a second opening aligned with said diametral passage in said stud.

15. Electrical metering apparatus as set forth in claim 14 wherein said lock is a barrel-type lock extending into said second opening and said diametral passage.

16. Electrical metering apparatus as set forth in claim 15 wherein said barrel lock has releasable means engaging said stud.

17. Electrical metering apparatus as set forth in claim 3 wherein said cover is larger than the opening of said cavity whereby a portion of said cover extends outwardly of said cavity, wherein said lock receiving means is outwardly of said cavity and is covered by said portion of said cover and wherein said lock extends through said portion of said cover.

* * * * *

UNITED STATES PATENT AND TRADEMARK OFFICE
CERTIFICATE OF CORRECTION

PATENT NO. : 4,823,572
DATED : April 25, 1989
INVENTOR(S) : John A. Signorelli

It is certified that error appears in the above-identified patent and that said Letters Patent is hereby corrected as shown below:

Column 2, line 41, delete the "d".

Column 2, line 41, before "locking" insert --The preferred--.

Column 4, line 50, after "prevents" delete the period ".".

Column 6, line 29, after "hole" delete "9", insert --69--.

Signed and Sealed this

Twenty-third Day of January, 1990

Attest:

JEFFREY M. SAMUELS

Attesting Officer     Acting Commissioner of Patents and Trademarks